United States Patent
Lee et al.

(10) Patent No.: US 12,414,326 B2
(45) Date of Patent: Sep. 9, 2025

(54) THIN FILM TRANSISTOR FEATURING VARIABLE THICKNESS GLUE LAYER WITH TAPERED END

(71) Applicant: Taiwan Semiconductor Manufacturing Company, Ltd., Hsinchu (TW)

(72) Inventors: Ya-Ling Lee, Hsinchu (TW); Wei-Gang Chiu, New Taipei (TW); Han-Ting Tsai, Kaoshiung (TW); Chung-Te Lin, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 732 days.

(21) Appl. No.: 17/674,811

(22) Filed: Feb. 17, 2022

(65) Prior Publication Data
US 2023/0261063 A1    Aug. 17, 2023

(51) Int. Cl.
*H10D 30/67* (2025.01)
*H01L 21/443* (2006.01)
*H10D 64/01* (2025.01)
*H10D 64/62* (2025.01)
*H10D 99/00* (2025.01)

(52) U.S. Cl.
CPC ....... *H10D 30/6729* (2025.01); *H01L 21/443* (2013.01); *H10D 64/01* (2025.01); *H10D 64/62* (2025.01); *H10D 99/00* (2025.01); *H10D 30/6755* (2025.01)

(58) Field of Classification Search
CPC .................... H01L 29/41733; H10D 30/6729
See application file for complete search history.

(56) References Cited

U.S. PATENT DOCUMENTS

| | | | |
|---|---|---|---|
| 7,193,327 B2 * | 3/2007 | Yu | H01L 23/53295 |
| | | | 257/E21.585 |
| 2020/0052129 A1 * | 2/2020 | Miyake | H10D 86/423 |
| 2020/0098625 A1 * | 3/2020 | Yin | H01L 21/76895 |
| 2022/0093616 A1 * | 3/2022 | Wei | H01L 29/78618 |

FOREIGN PATENT DOCUMENTS

CN    113921399 A * 1/2022 ....... H01L 21/76843

* cited by examiner

*Primary Examiner* — Davienne N Monbleau
*Assistant Examiner* — Dmitri Mihaliov
(74) *Attorney, Agent, or Firm* — JCIPRNET

(57) ABSTRACT

A semiconductor device includes a substrate, a gate electrode, a gate dielectric layer, a channel layer, a source electrode and a drain electrode. The gate electrode is disposed over the substrate. The gate dielectric layer is disposed over the gate electrode. The channel layer is disposed over the gate dielectric layer. The source electrode and the drain electrode are disposed over the channel layer and beside the gate electrode. In some embodiments, each of the source electrode and the drain electrode includes a glue layer and a metal pattern, and a thickness of the glue layer adjacent to a sidewall of the metal pattern is greater than a thickness of the glue layer adjacent to a bottom of the metal pattern.

20 Claims, 7 Drawing Sheets

THIN FILM TRANSISTOR FEATURING VARIABLE THICKNESS GLUE LAYER WITH TAPERED END

BACKGROUND

Semiconductor devices are used in a variety of electronic applications, such as personal computers, cell phones, digital cameras, and other electronic equipment. Some semiconductor devices such as thin film transistors have attracted high attention due to the associated low cost, room temperature manufacturing process, high mobility for high speed operation, and the compatibility with transparent, flexible and light display applications. Although the existing semiconductor devices have generally been adequate for their intended purposes, they have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
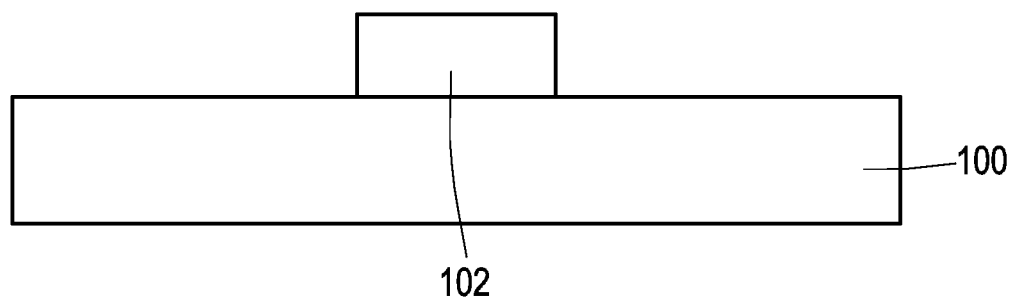
FIG. 1 to FIG. 6 illustrate cross-sectional views of forming a semiconductor device in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is directed to semiconductor devices, and specifically to back/bottom gate semiconductor metal oxide transistor devices, which may be thin film transistor (TFT) devices and methods of forming the same. In the disclosure, the glue layers of source and drain electrodes are selectively formed on sidewalls of the source and drain electrodes, with the minimum amount (even zero) on bottoms of the source and drain electrodes, so as to reduce the contact resistance (Rc) delay and therefore improve the performance of the device.

FIG. 1 to FIG. 6 illustrate cross-sectional views of forming a semiconductor device in accordance with some embodiments. It is understood that the disclosure is not limited by the method described below. Additional operations can be provided before, during, and/or after the method and some of the operations described below can be replaced or eliminated, for additional embodiments of the methods.

Referring to FIG. 1, a substrate 100 is provided. In some embodiments, the substrate 100 is a transparent substrate, such as a glass substrate. However, the disclosure is not limited thereto. In some embodiments, the substrate 100 has a device layer and a dielectric layer (e.g., silicon oxide layer) formed over the device layer. In such embodiments, the component (e.g., thin film transistor) described below is formed on the dielectric layer over the device layer. In some embodiments, the device layer includes a transistor formed on a semiconductor substrate. The semiconductor substrate includes a bulk semiconductor, a semiconductor-on-insulator (SOI) substrate, or the like, which may be doped (e.g., with a p-type or an n-type dopant) or undoped. The transistor may include a fin field effect transistor (FinFET), a nanostructure FET (nano-FET) (e.g., a nanosheet transistor, a nanowire transistor or a gate-all-around transistor), a planar FET, the like, or a combination thereof. In some embodiments, the device layer further includes an interconnect structure electrically connected to the transistor, and the dielectric layer is formed over the interconnect structure.

Still referring to FIG. 1, a gate electrode 102 is formed on the substrate 100. In some embodiments, the gate electrode 102 includes a conductive material, such as Cu, Al, Ti, Ta, W, Ru, Co, Ni, the like, an alloy thereof, or a combination thereof. Other suitable gate electrode materials are within the contemplated scope of the disclosure. In some embodiments, a barrier layer and/or a seed layer is formed between the gate electrode layer 102 and the substrate 100. In some embodiments, the barrier layer includes Ti, TiN, Ta, TaN, the like or a combination thereof. In some embodiments, the seed layer includes Ti, Cu, Au, Ni, the like, or a combination thereof.

In some embodiments, the gate electrode 102 is formed by depositing a gate electrode material over the substrate with a physical vapor deposition (PVD) process, a chemical vapor deposition (CVD) process, a plasma enhanced CVD (PECVD) process, an atomic layer deposition (ALD), or the like, and patterning the gate electrode material with photolithography and etching processes. However, the disclosure is not limited thereto. In some embodiments, the gate electrode 102 is formed by an electroplating process.

Referring to FIG. 1B, a gate dielectric layer 104 is formed over the substrate 100 and covers the gate electrode 102. In some embodiments, the gate dielectric layer 104 includes silicon oxide, silicon oxynitride or the like. However, the disclosure is not limited thereto. In some embodiments, the gate dielectric layer 104 includes a high-k material having a dielectric constant greater than about 4, greater than about 10 or even greater than about 20, such as zirconium dioxide ($ZrO_2$), aluminum oxide ($Al_2O_3$), hafnium oxide ($HfO_2$), tantalum oxide ($Ta_2O_5$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), zirconium silicate, zirconium aluminate, titanium oxide, a hafnium dioxide-alumina ($HfO_2$—$Al_2O_3$) alloy, the like, or a combination thereof. Other suitable gate dielectric materials are within the contemplated scope of the disclosure. In some embodiments, the gate dielectric layer is a single layer such as a silicon oxide layer or a high-k layer. In other embodiments, the gate dielectric layer 104 has a multi-layer structure (e.g., including a lower silicon oxide layer and an upper high-k layer).

In some embodiments, the method of forming the gate dielectric layer 104 includes performing a suitable deposition process, such as a physical vapor deposition (PVD) process, a chemical vapor deposition (CVD) process, a plasma enhanced CVD (PECVD) process, an atomic layer deposition (ALD), or the like.

Thereafter, a channel layer 106 is formed over the gate dielectric layer 104. In some embodiments, the channel layer 106 includes a semiconductor material such as a metal oxide material. In some embodiments, the channel layer 106 includes at least one element selected from the group consisting In, Ga, Zn, W, Sn, Cd, Al and O. For example, the channel layer 106 includes, indium tungsten oxide (IWO), indium zinc oxide (IZO), indium tin oxide (ITO), indium gallium oxide (IGO), aluminum zinc oxide (AZO), gallium zinc oxide (GZO), gallium oxide (GaO), indium oxide (InO), zinc oxide (ZnO), the like, or a combination thereof, and each of the mentioned materials may be doped or undoped. In some embodiments, the channel layer 106 is a single layer such as an IGZO layer. In other embodiments, the channel layer 106 has a multi-layer structure. For example, the channel layer 106 includes, from bottom to top, an IGZO layer and an InO layer. For example, the channel layer 106 includes, from bottom to top, a GZO layer and an InO layer. For example, the channel layer 106 includes, from bottom to top, an IGZO layer and an IZO layer. For example, the channel layer 106 includes, from bottom to top, an IGZO layer and an IGO layer. For example, the channel layer 106 includes, from bottom to top, an InO layer, a GaO layer, a ZnO layer, a GaO layer and an InO layer.

The above embodiments in which the channel layer 106 includes a metal oxide layer are provided for illustration purposes, and are not construed as limiting the present disclosure. In some embodiments, the channel layer 106 may include silicon, such as amorphous silicon, microcrystalline silicon or polysilicon. Other suitable channel materials are within the contemplated scope of the disclosure.

In some embodiments, the channel layer 106 is formed by depositing a channel material over the substrate with a physical vapor deposition (PVD) process, a chemical vapor deposition (CVD) process, a plasma enhanced CVD (PECVD) process, an atomic layer deposition (ALD), or the like, and patterning the channel material with photolithography and etching processes. In some embodiments, the channel layer 106 exposed a portion of the gate dielectric layer 104.

Figure 2:
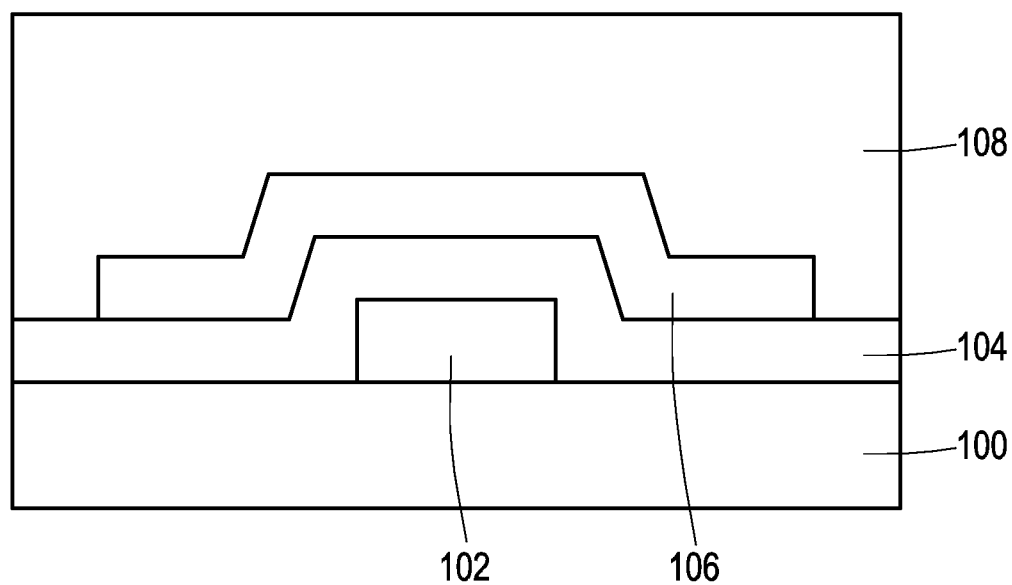

Still referring to FIG. 2, a dielectric layer 108 is formed over the channel layer 106 and covers the exposed portion of the gate dielectric layer 104. In some embodiments, the dielectric layer 108 may include an insulating material, such as silicon oxide, silicon nitride, silicon oxynitride, aluminum oxide, aluminum nitride, the like, or a combination thereof.

In some embodiments, the dielectric layer includes a low-k material having a dielectric constant less than about 4, less than about 3 or even less. For example, the low-k material includes a polymer containing Si, C, O and/or H, such as methylsiloxane, methylsilsesquioxanes, or an organic and inorganic polymer. For example, the low-k material includes SiCH, SiOCH, carbon-doped oxide (CDO), silicon-oxycarbide, or organosilicate glass (OSG). Other suitable dielectric materials are within the contemplated scope of the disclosure.

In some embodiments, the method of forming the dielectric layer 108 includes performing a suitable deposition process, such as a physical vapor deposition (PVD) process, a chemical vapor deposition (CVD) process, a plasma enhanced CVD (PECVD) process, an atomic layer deposition (ALD), or the like. A spin-on technique may be applicable.

Figure 3:
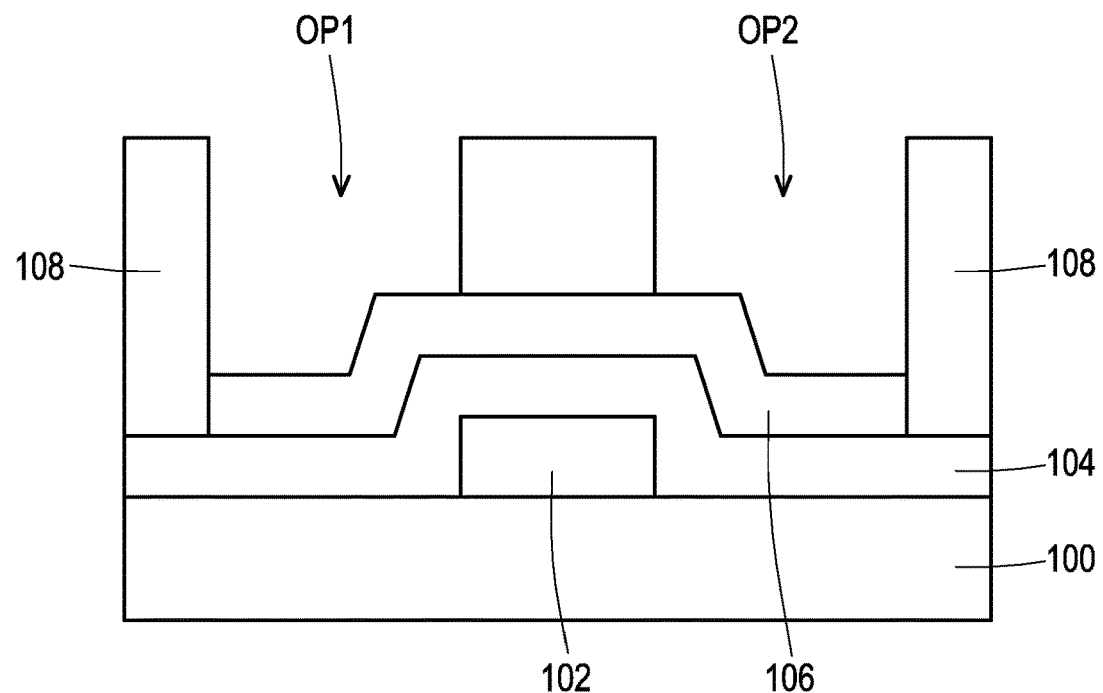

Referring to FIG. 3, the dielectric layer 108 is patterned to form first and second opening OP1 and OP2 therein. In some embodiments, a mask layer (e.g., a photoresist material or a dielectric mask material) is formed over the dielectric layer 108, and the dielectric layer 108 is partially removed by using the mask layer as an etching mask. In some embodiments, each of the first and second opening OP1 and OP2 penetrates through the dielectric layer 108 and exposes a portion of the channel layer 106. Specifically, each of the first and second opening OP1 and OP2 has a stepped bottom (e.g., one-step bottom) exposed by the channel layer 106 and a substantially vertical sidewall exposed by the dielectric layer 108. In some embodiments, the sidewall of each of the first and second openings OP1 and OP1 may be inclined upon the process requirements.

In some embodiments, the sidewall of each of the first and second openings OP1 and OP2 is aligned with the sidewall of the channel layer 106, as shown in FIG. 3. However, the disclosure is not limited thereto. In other embodiments, the sidewall of each of the first and second openings OP1 and OP2 is misaligned with the sidewall of the channel layer 106. For example, the sidewall of the channel layer 106 extends outwardly from the sidewall of each of the first and second openings OP1 and OP2.

Figure 4:
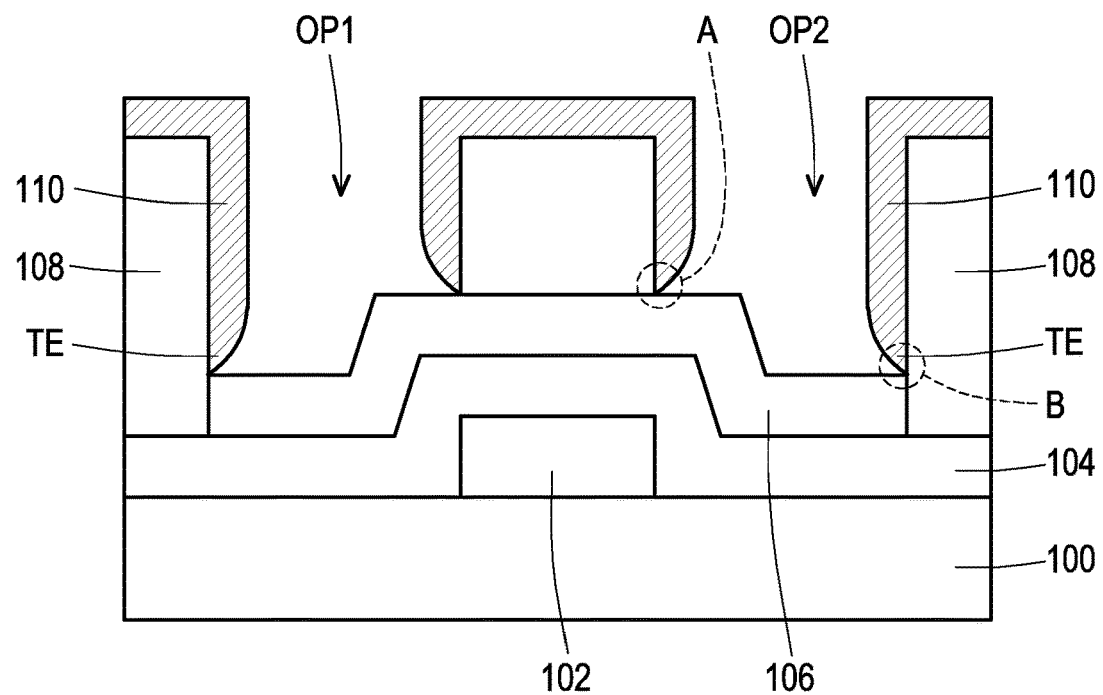

Referring to FIG. 4, a glue layer 110 is formed over the dielectric layer 108 and in the first and second openings OP1 and OP2. In the disclosure, the glue layer 110 is designed to have different growth rates on different materials, so as to improve the adhesion of the subsequently formed source/drain electrodes, but without affecting the resistances of the source/drain electrodes. In some embodiments, since the dielectric layer 108 (e.g. silicon oxide) and the channel layer 106 (e.g., IGZO) are made by different materials, the glue layer 110 are grown with different growth rates. Accordingly, the formed thickness of the glue layer 110 on the dielectric layer 108 (e.g. silicon oxide) is different from the formed thickness of the glue layer 110 on the channel layer 106 (e.g., IGZO).

In some embodiments, the glue layer 110 has a vertically straight sidewall away from the channel layer 106 and a curved sidewall towards the channel layer 106. In some embodiments, the glue layer 110 has a tapered end portion TE towards the top surface of the channel layer 106. In some embodiments, the tapered end portions TE of the glue layer 110 are in "point contact" with the channel layer 106 (marked in dotted regions A and B) while in "surface contact" with the dielectric layer 108, as shown in FIG. 4. Specifically, the contact area between the glue layer 110 and the dielectric layer 110 is greater than the contact area (almost zero) between the glue layer 110 and the channel layer 106.

When the precursors and reaction parameters are appropriately selected, the glue layer 110 is selectively formed on the dielectric layer 108, rather than on the channel layer 106. In some embodiments, when the growth rate of the glue layer 110 formed on the dielectric layer 108 is greater than the growth rate of the glue layer 110 formed on the channel layer 106, the glue layer 110 is selectively formed on the top surface of the dielectric layer 108 and on the sidewalls of the first and second openings OP1 and OP2 exposed by the dielectric layer 110. Specifically, the glue layer 110 is selectively formed merely on the dielectric layer 108, as shown in FIG. 4. However, the disclosure is not limited thereto. In other embodiments, the glue layer 110 is formed thicker on the dielectric layer 108 while formed thinner on the channel layer 106.

Figure 7:
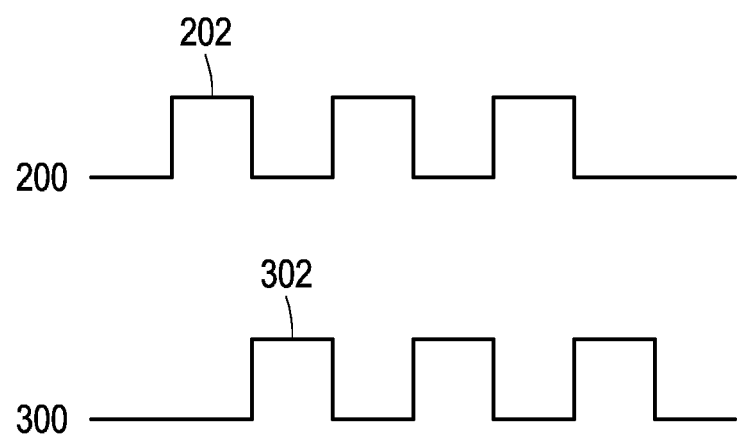
FIG. 7 is a graph of sequence of pulses of different precursors in accordance with some embodiments.

In some embodiments, the glue layer 110 includes WCN, WN or the like, and such material exhibit different growth rates for different materials. In some embodiments, the precursors of the glue layer 110 include a tungsten-containing precursor 200 and a nitrogen-containing precursor 300, as shown in FIG. 7.

In some embodiments, the nitrogen-containing precursor 300 includes, for example but not limited thereto, $NH_3$ or $N_2$. Other suitable nitrogen-containing precursors are within the contemplated scope of the disclosure.

In some embodiments, the tungsten-containing precursor includes:
  bis(tert-butylimino)bis(dimethylamino)tungsten(VI),
  bis(iso-butylimino)bis(dimethylamino)tungsten(VI),
  bis(neo-pentylimino)bis(dimethylamino)tungsten(VI),
  bis(isopropylimino)bis(dimethylamino)tungsten(VI),
  bis(cyclopentadienylimino)bis(dimethylamino)tungsten(VI), or
  bis(methylcyclopentadienylimino)bis(dimethylamino)tungsten(VI).

Other suitable tungsten-containing precursors are within the contemplated scope of the disclosure.

FIG. 7 is a graph of sequence of pulses of different precursors in accordance with some embodiments. In some embodiments, the method of forming glue layer 110 includes introducing first pulses 202 of a tungsten-containing precursor 200 and second pulses 302 of a nitrogen-containing precursor 300 into the same process chamber (e.g., ALD chamber). In some embodiments, the first pulses 202 of the tungsten-containing precursor 200 are not overlapped with the second pulses 302 of the nitrogen-containing precursor 300. Specifically, the first pulses 202 of the tungsten-containing precursor 200 and the second pulses 302 of the nitrogen-containing precursor 300 are introduced into the process chamber alternately. However, the disclosure is not limited thereto. In other embodiments, the first pulses 202 of the tungsten-containing precursor 200 may be partially overlapped with the second pulses 302 of the nitrogen-containing precursor 300. In some embodiments, the process temperature ranges from about 350° C. to 450° C., and the chamber pressure ranges from about 3 torr to 30 torr. In some embodiments, a dilute gas such as an inert gas (e.g., argon) may be introduced to the process chamber during the operation of forming the glue layer 110. In some embodiments, a hydrogen-containing gas (e.g., $H_2$) may be introduced to the process chamber during the operation of forming the glue layer 110 upon the process requirements.

The above embodiments in which the glue layer 110 is formed with an atomic layer deposition (ALD) process are provided for illustration purposes, and are not construed as limiting present disclosure. In other embodiments, the glue layer 110 is formed with a physical vapor deposition (PVD) process, a chemical vapor deposition (CVD) process, a plasma enhanced CVD (PECVD) process, or the like.

Figure 5:
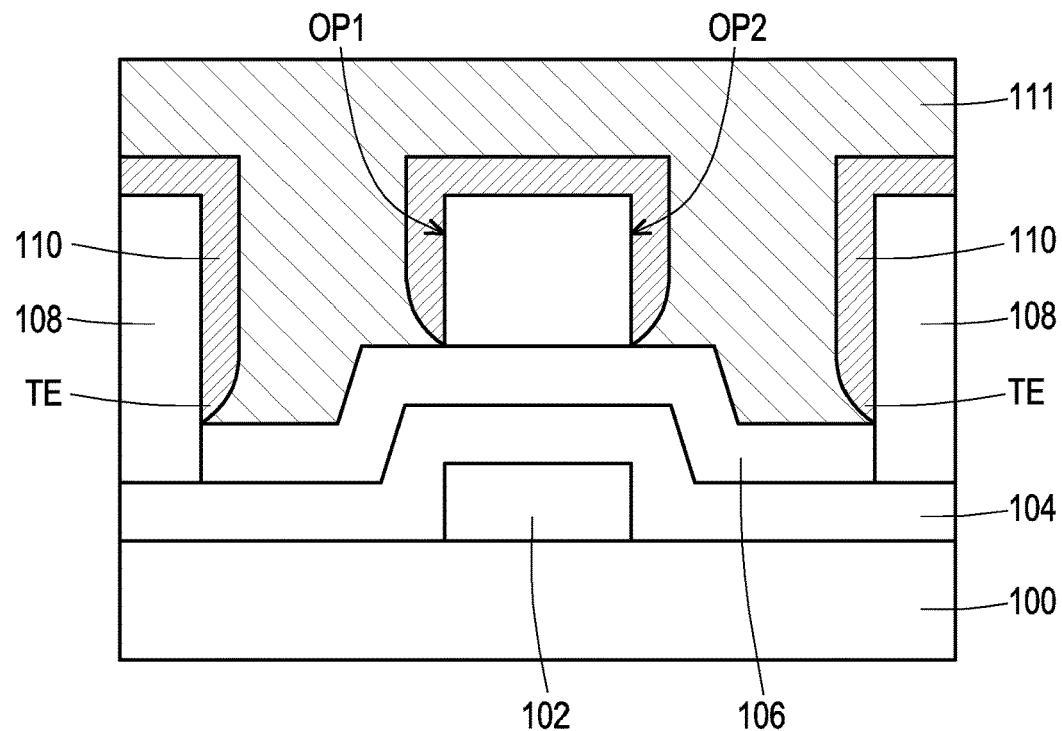

Referring to FIG. 5, a metal layer 111 is formed over the glue layer 110 and filled into the first and second openings OP1 and OP2. In some embodiments, the metal layer 111 includes a conductive material, such as Cu, Al, Ti, Ta, W, Ru, Co, Ni, the like, an alloy thereof, or a combination thereof. Other suitable metal materials for source and drain electrodes are within the contemplated scope of the disclosure. In some embodiments, a barrier layer and/or a seed layer is formed between the metal layer 111 and the channel layer 106. In some embodiments, the barrier layer includes Ti, TiN, Ta, TaN, the like or a combination thereof. In some embodiments, the seed layer includes Ti, Cu, Au, Ni, the like, or a combination thereof.

In some embodiments, the method of forming the metal layer 111 includes performing a physical vapor deposition (PVD) process, a chemical vapor deposition (CVD) process, a plasma enhanced CVD (PECVD) process, an atomic layer deposition (ALD), or the like.

Figure 6:
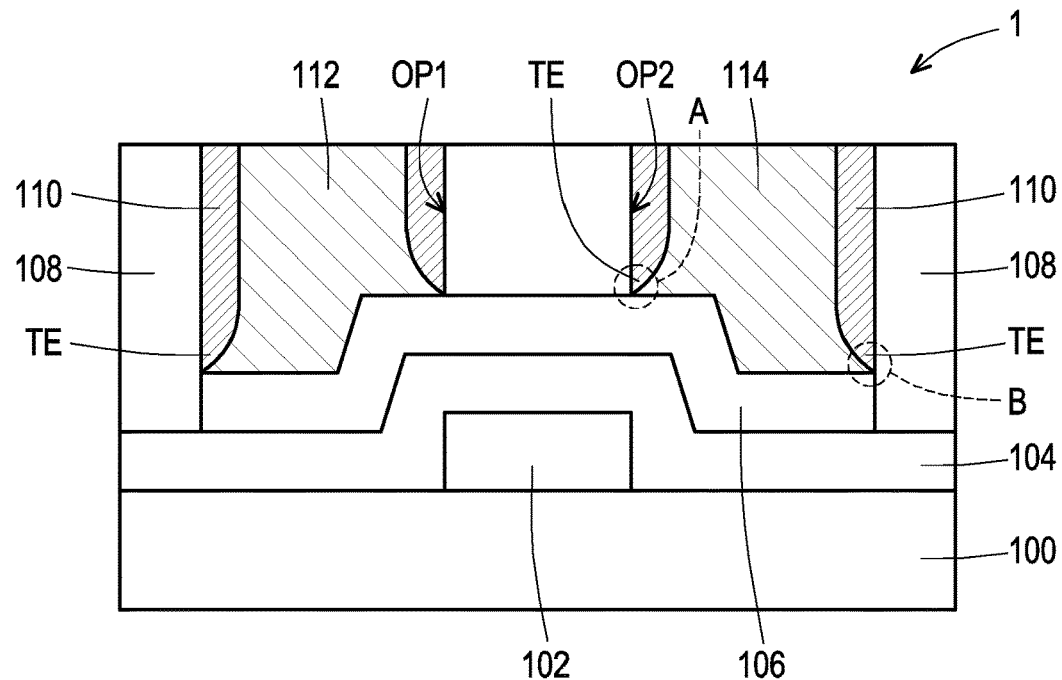

Referring to FIG. 6, a planarization process is performed to the metal layer 111 and the glue layer 110, so as to remove the excess materials outside of the first and second openings OP1 and OP2. In some embodiments, a portion of the metal layer 111 and a portion of the glue layer 110 are removed with a planarization process, such as a chemical mechanical polishing (CMP) process. The remaining metal layer 111 forms a metal pattern 112 in the first opening OP1 and a metal pattern 114 in the second opening OP2. In some embodiments, the metal pattern 112 is referred to as a source electrode, and the metal pattern 114 is referred to as a drain electrode in some examples. The terms of "metal patterns" and "source/drain electrodes" may exchangedly use through the specification. The glue layer 110 is regarded as part of the source and drain regions in some examples. Upon the CMP process, the tops of the glue layer 110, the source electrode 112 and the drain electrode 114 are substantially coplanar or flushed with each other. A semiconductor device 1 of some embodiments is thus completed. The semiconductor device 1 is referred to as a "thin film transistor (TFT)" in some examples.

In the semiconductor device 1, the source electrode 112 and the drain electrode 114 are in physical contact with the underlying channel layer 106, so that the contact resistance (Rc) delay of the source electrode 112 and the drain electrode 114 are improved, and thus, the performance of the device is accordingly improved.

Figure 8:
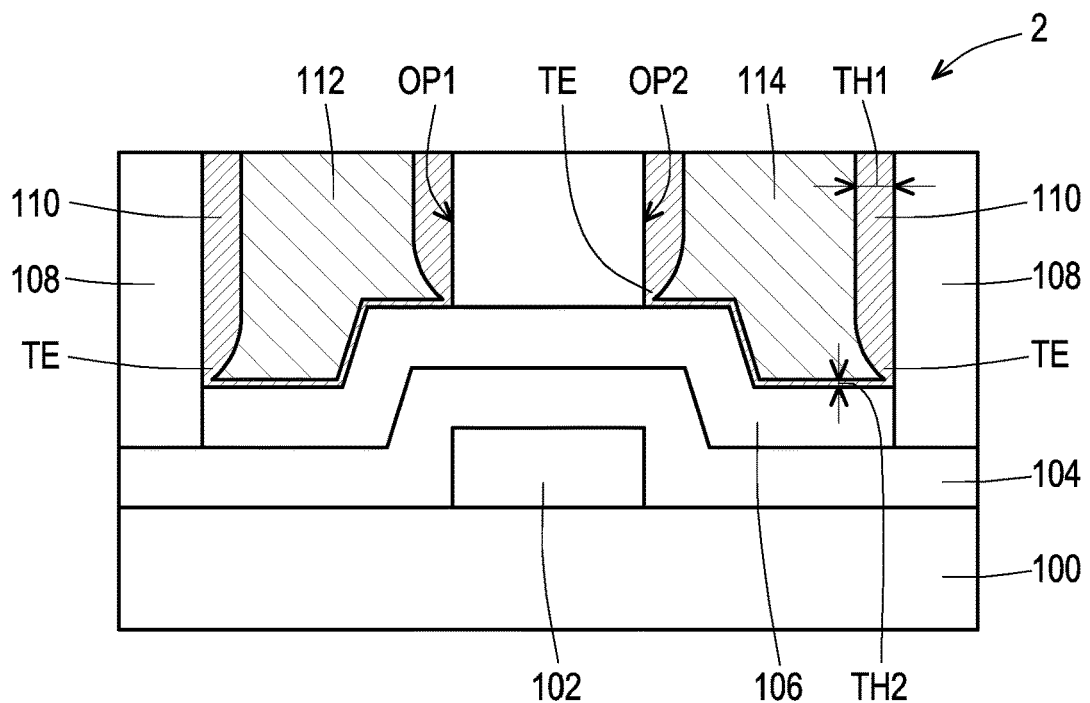
FIG. 8 to FIG. 10 illustrate cross-sectional views of various semiconductor devices in accordance with other embodiments.
Figure 9:
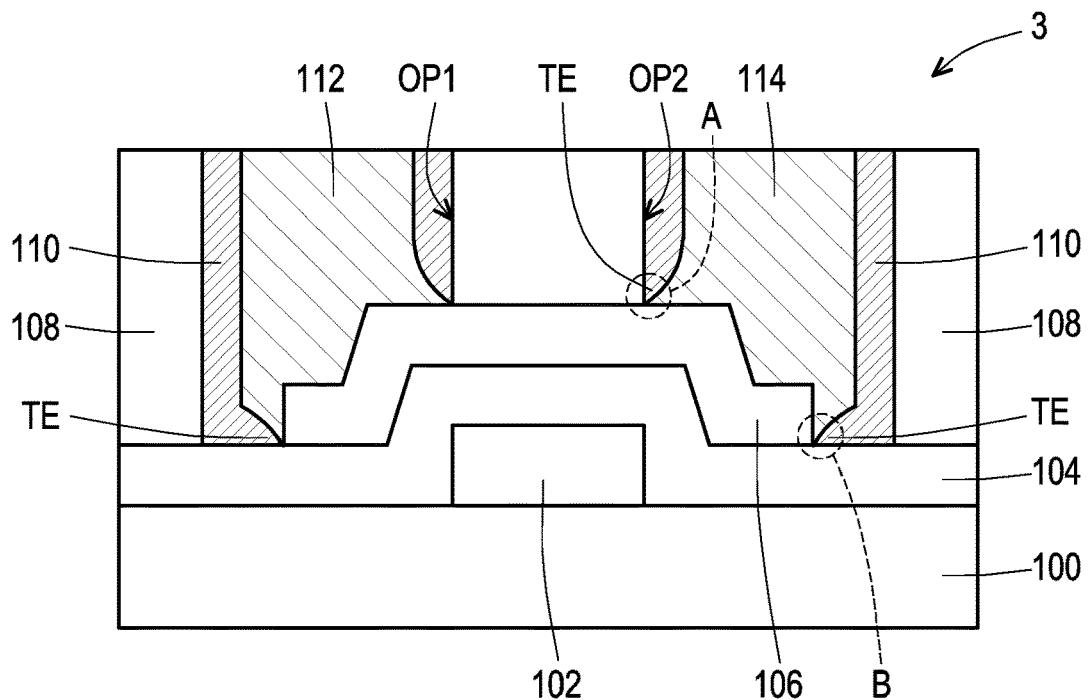
Figure 10:
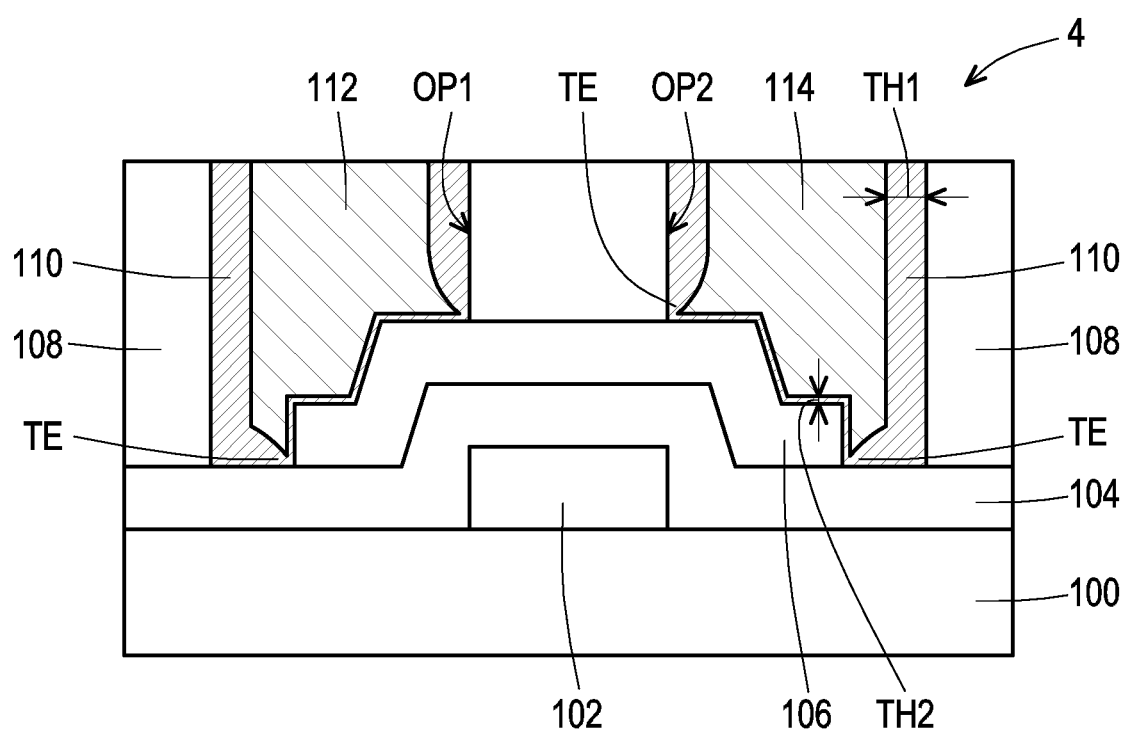

The semiconductor device 1 of FIG. 6 may be modified to have other configurations, as shown in FIG. 8 to FIG. 10. Each of the semiconductor devices in FIG. 8 to FIG. 10 may be similar to the semiconductor device 1 in FIG. 6, with similar features of the semiconductor devices being labeled with similar numerical references and descriptions of the similar features are not repeated herein.

The semiconductor device 2 of FIG. 8 may be similar to the semiconductor device 1 of FIG. 6, and the difference between them lies in the configuration of the glue layer 110. In the semiconductor device 1 of FIG. 6, the glue layer 110 is merely formed on the dielectric layer 108, as shown in FIG. 6. In the semiconductor device 2 of FIG. 8, the glue layer 110 may be formed thicker on the dielectric layer 108 but formed thinner on the channel layer 106. For example, the glue layer 110 has a first thickness TH1 on the dielectric layer 108 and a second thickness TH2 on the channel layer 106. For example, the first thickness TH1 of the glue layer 110 (including the tapered end portion) ranges from about 1 angstrom to 200 angstroms (e.g., 20 angstrom to 100 angstroms), and the second thickness TH2 of the glue layer 110 ranges from about 1 to 5 angstroms (e.g., 2 angstrom to 3 angstroms). The second thickness TH2 is such thin, without affecting the resistances of the subsequently formed source/drain electrodes.

In some embodiments, the ratio of the first thickness TH1 to the second thickness TH2 ranges from about 20:1 to 100:1, such as 50:1. In some embodiments, the ratio of the first thickness TH1 to the second thickness TH2 can be, for example but is not limited to, about 30:1, 40:1, 50:1, 60:1, 70:1, 80:1, 90:1, including any range between any two of the preceding values and any range more than any one of the preceding values. In some embodiments, the ratio of the first thickness TH1 to the second thickness TH2 is such as to improve the properties of the source/drain regions.

The semiconductor device 3 of FIG. 9 may be similar to the semiconductor device 1 of FIG. 6, and the difference between them lies in the shapes of the glue layer 110 and the source and drain electrodes 112 and 114. In the semiconductor device 1 of FIG. 6, the source and drain electrodes 112 and 114 are merely in contact with the channel layer 106, and each of the source and drain electrodes 112 and 114 has a stepped bottom (e.g., one-step bottom), as shown in FIG. 6. In the semiconductor device 3 of FIG. 9, the source and drain electrodes 112 and 114 are in contact with the channel layer 106 and the gate dielectric layer 104, and each of the source and drain electrodes 112 and 114 has a stepped bottom (e.g., two-step bottom). The method of forming the semiconductor device 3 is similar to operations described in FIG. 1 to FIG. 6, except that during the operation of forming first and second openings OP1 and OP2 in FIG. 3, the first and second openings OP1 and OP2 further expose a portion of the gate dielectric layer 104.

The growth rate of the glue layer 110 formed on the dielectric layer 108 is similar to the growth rate of the glue layer 110 formed on the gate dielectric layer 104, but different from the growth rate of the glue layer 110 formed on the channel layer 106. Accordingly, the glue layer 110 is selectively formed on the dielectric layer 108 and the gate dielectric layer 104, rather than on the channel layer 106.

In some embodiments, the glue layer 110 has a vertically straight sidewall away from the channel layer 106 and a curved sidewall towards the channel layer 106. In some embodiments, the glue layer 110 has a tapered end portion TE towards the sidewall of the channel layer 106. In some embodiments, the tapered end portions TE of the glue layer 110 are in "point contact" with the channel layer 106 (marked in dotted regions A and B) while in "surface contact" with the dielectric layer 108 and the gate dielectric layer 104, as shown in FIG. 8. Specifically, the contact area between the glue layer 110 and each of the dielectric layer 110 and the gate dielectric layer 104 is greater than the contact area (almost zero) between the glue layer 110 and the channel layer 106.

The semiconductor device 4 of FIG. 10 may be similar to the semiconductor device 3 of FIG. 9, and the difference between them lies in the configuration of the glue layer 110. In the semiconductor device 2 of FIG. 8, the glue layer 110 is formed on the dielectric layer 108 and the gate dielectric layer 104, as shown in FIG. 8. In the semiconductor device 4 of FIG. 10, the glue layer 110 may be formed thicker on the dielectric layer 108 and the gate dielectric layer 104 but formed thinner on the channel layer 106. For example, the glue layer 110 has a first thickness TH1 on the dielectric layer 108 and a second thickness TH2 on the channel layer. In some embodiments, the ratio of the first thickness TH1 to the second thickness TH2 ranges from about 20:1 to 100:1, such as 50:1. For example, the first thickness TH1 of the glue layer 110 (including the tapered end portion) ranges from about 1 angstrom to 200 angstroms (e.g., 20 angstroms to 100 angstroms), and the second thickness TH2 of the glue layer 110 ranges from about 1 to 5 angstroms (e.g., 2 angstrom to 3 angstroms).

In accordance with some embodiments of the present disclosure, a semiconductor device 1/2/3/4 includes a substrate 100, a gate electrode 102, a gate dielectric layer 104, a channel layer 106, a source electrode and a drain electrode. The gate electrode 102 is disposed over the substrate 100. The gate dielectric layer 104 is disposed over the gate electrode 102. The channel layer 106 is disposed over the gate dielectric layer 104. The source electrode and the drain electrode are disposed over the channel layer 106 and beside the gate electrode 102. In some embodiments, the source electrode includes a glue layer 110 and a metal pattern 112, and the drain electrode includes a glue layer 110 and a metal pattern 114. In some embodiments, a thickness of the glue layer 110 adjacent to a sidewall of the metal pattern 112/114 is greater than a thickness of the glue layer 110 adjacent to a bottom of the metal pattern 112/114.

In some embodiments, the thickness of the glue layer 110 adjacent to the sidewall of the metal pattern 112/114 is greater than the thickness of the glue layer 110 adjacent to the bottom of the metal pattern 112/114, as shown in FIG. 6 and FIGS. 8-10. In some embodiments, the thickness of the glue layer 110 adjacent to the bottom of the metal pattern 112/114 is approximately zero, as shown in FIG. 6 and FIG. 9. In some embodiments, the glue layer 110 has a tapered end portion TE. In some embodiments, the metal pattern 112/114 is in contact with the channel layer 106, as shown in FIG. 6 and FIGS. 8-10. In some embodiments, the metal pattern 112/114 is in contact with the channel layer 106 and the gate dielectric layer 104, as shown in FIG. 8 and FIG. 10. In some embodiments, a thickness of the glue layer 110 on the channel layer 106 is different from a thickness of the glue layer 110 on the gate dielectric layer 104. In some embodiments, the thickness of the glue layer 110 on the channel layer 106 is less than the thickness of the glue layer on the gate dielectric layer 104. In some embodiments, the glue layer 110 includes WCN, WN or a combination thereof.

In accordance with some embodiments of the present disclosure, a semiconductor device 1/2/3/4 includes a substrate 100, a gate electrode 102, a gate dielectric layer 104, a channel layer 106, a source electrode and a drain electrode. The gate electrode 102 is disposed over the substrate 100. The gate dielectric layer 104 is disposed over the gate electrode 102. The channel layer 106 is disposed over the gate dielectric layer 104. The source electrode and the drain electrode are disposed over the channel layer and beside the gate electrode, wherein each of the source electrode and the drain electrode includes a glue layer and a metal pattern, and the glue layer includes WCN, WN or a combination thereof. In some embodiments, each of the source electrode and the drain electrode is free of titanium nitride (TiN).

In some embodiments, the semiconductor device 1/2/3/4 further includes a dielectric layer 108 aside the source electrode and the drain electrode, wherein the metal pattern 112/114 is in contact with the channel layer 106 while separated from the dielectric layer 108. In some embodiments, the glue layer 110 is further disposed between the gate dielectric layer 104 and the metal pattern 112/114. In some embodiments, the glue layer 110 has a tapered end portion TE. In some embodiments, the channel layer 106 includes at least one element selected from the group consisting In, Ga, Zn, W, Sn, Cd, Al and O.

A glue layer is contemplated as falling within the spirit and scope of the present disclosure, as long as such glue layer improves the adhesion of the subsequently formed source/drain electrodes, but without affecting the resistances of the source/drain electrodes.

Figure 11:
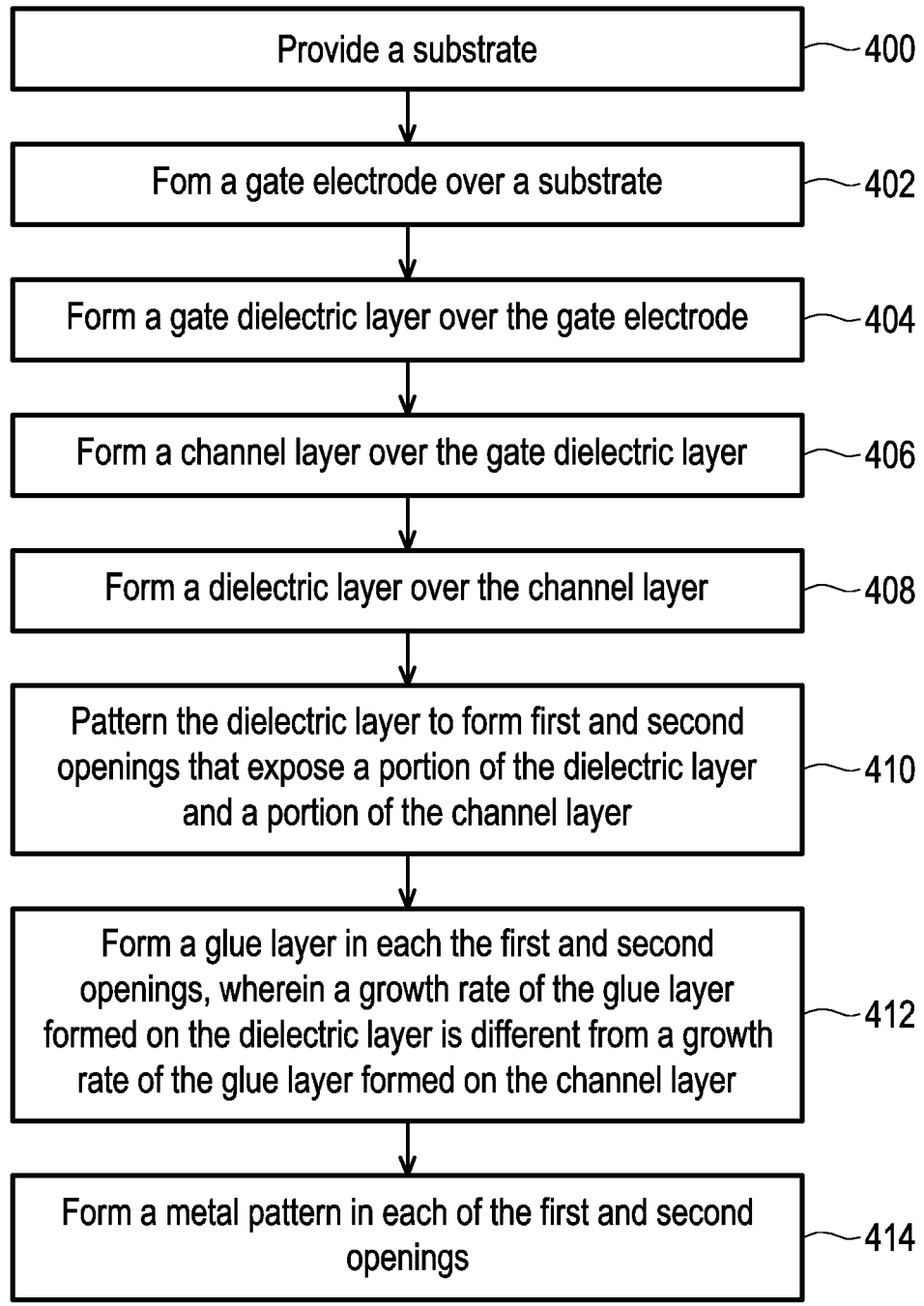
FIG. 11 illustrates a method of forming a semiconductor device in accordance with some embodiments.

FIG. 11 illustrates a method of forming a semiconductor device in accordance with some embodiments. Although the method is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 400, a substrate is provided. FIG. 1 illustrates a cross-sectional view corresponding to some embodiments of act 400.

At act 402, a gate electrode is formed over the substrate. FIG. 1 illustrates a cross-sectional view corresponding to some embodiments of act 402.

At act 404, a gate dielectric layer is formed over the gate electrode. FIG. 2 illustrates a cross-sectional view corresponding to some embodiments of act 404.

At act 406, a channel layer is formed over the gate dielectric layer. FIG. 2 illustrates a cross-sectional view corresponding to some embodiments of act 406.

At act 408, a dielectric layer is formed over the channel layer. FIG. 2 illustrates a cross-sectional view corresponding to some embodiments of act 408.

At act 410, the dielectric layer is patterned to form first and second openings that expose a portion of the dielectric layer and a portion of the channel layer. FIG. 3 illustrates a cross-sectional view corresponding to some embodiments of act 410.

At act 412, a glue layer is formed in each the first and second openings, wherein a growth rate of the glue layer formed on the dielectric layer is different from a growth rate of the glue layer formed on the channel layer. FIG. 4 illustrates a cross-sectional view corresponding to some embodiments of act 412. In some embodiments, the glue layer is merely formed on the dielectric layer. In other embodiments, the glue layer is formed thicker on the dielectric layer while formed thinner on the channel layer.

In some embodiments, precursors of forming the glue layer include a tungsten-containing precursor and a nitrogen-containing precursor.

In some embodiments, the nitrogen-containing precursor includes $NH_3$ or $N_2$. In some embodiments, the tungsten-containing precursor includes:
 bis(tert-butylimino)bis(dimethylamino)tungsten(VI),
 bis(iso-butylimino)bis(dimethylamino)tungsten(VI),
 bis(neo-pentylimino)bis(dimethylamino)tungsten(VI),
 bis(isopropylimino)bis(dimethylamino)tungsten(VI),
 bis(cyclopentadienylimino)bis(dimethylamino)tungsten(VI), or
 bis(methylcyclopentadienylimino)bis(dimethylamino)tungsten(VI).

At act 414, a metal pattern is formed in each of the first and second openings. FIG. 5 to FIG. 6 illustrate cross-sectional views corresponding to some embodiments of act 414.

In the disclosure, the glue layers of source and drain electrodes are selectively formed on sidewalls of the source and drain electrodes, with the minimum amount (even zero) on bottoms of the source and drain electrodes, so as to reduce the contact resistance (Rc) delay and therefore improve the performance of the device.

Many variations of the above examples are contemplated by the present disclosure. It is understood that different embodiments may have different advantages, and that no particular advantage is necessarily required of all embodiments.

In accordance with some embodiments of the present disclosure, a semiconductor device includes a substrate, a gate electrode, a gate dielectric layer, a channel layer, a source electrode and a drain electrode. The gate electrode is disposed over the substrate. The gate dielectric layer is disposed over the gate electrode. The channel layer is disposed over the gate dielectric layer. The source electrode and the drain electrode are disposed over the channel layer and beside the gate electrode. In some embodiments, each of the source electrode and the drain electrode includes a glue layer and a metal pattern, and a thickness of the glue layer adjacent to a sidewall of the metal pattern is greater than a thickness of the glue layer adjacent to a bottom of the metal pattern.

In accordance with some embodiments of the present disclosure, a semiconductor device includes a substrate, a gate electrode, a gate dielectric layer, a channel layer, a source electrode and a drain electrode. The gate electrode is disposed over the substrate. The gate dielectric layer is disposed over the gate electrode. The channel layer is disposed over the gate dielectric layer. The source electrode and the drain electrode are disposed over the channel layer and beside the gate electrode, wherein each of the source electrode and the drain electrode includes a glue layer and a metal pattern, and the glue layer includes WCN, WN or a combination thereof. In accordance with some embodiments of the present disclosure, a method of forming a semiconductor device includes following operations. A substrate is provided. A gate electrode is formed over a substrate. A gate dielectric layer is formed over the gate electrode. A channel layer is formed over the gate dielectric layer. A dielectric layer is formed over the channel layer. The dielectric layer is patterned to form first and second openings that expose a portion of the dielectric layer and a portion of the channel layer. A glue layer is formed in each the first and second openings, wherein a growth rate of the glue layer formed on the dielectric layer is different from a growth rate of the glue layer formed on the channel layer. A metal pattern is formed in each of the first and second openings.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a substrate;
a gate electrode disposed over the substrate;
a gate dielectric layer disposed over the gate electrode;
a channel layer disposed over the gate dielectric layer; and
a source electrode and a drain electrode disposed over the channel layer and beside the gate electrode,
wherein each of the source electrode and the drain electrode comprises a glue layer and a metal pattern,
wherein a thickness of the glue layer includes a variable thickness between the metal pattern and the gate dielectric layer, and the thickness of the glue layer is a minimum distance between an inner surface of the glue layer and an outer surface of the glue layer, and
wherein the glue layer between the metal pattern and the gate dielectric layer has a tapered thickness towards the channel layer.

2. The semiconductor device of claim 1, wherein each of the source electrode and the drain electrode has an uneven bottom.

3. The semiconductor device of claim 1, wherein each of the source electrode and the drain electrode has a stepped bottom.

4. The semiconductor device of claim 1, wherein the channel layer comprises at least one element selected from the group consisting of In, Ga, Zn, W, Sn, Cd, Al and O.

5. The semiconductor device of claim 1, wherein the metal pattern is separated from the channel layer.

6. The semiconductor device of claim 1, wherein the glue layer is further disposed between the metal pattern and each of the channel layer and the gate dielectric layer.

7. The semiconductor device of claim 6, wherein a thickness of the glue layer on the channel layer is different from the thickness of the glue layer on the gate dielectric layer.

8. The semiconductor device of claim 7, wherein the thickness of the glue layer on the channel layer is less than the thickness of the glue layer on the gate dielectric layer.

9. The semiconductor device of claim 1, wherein the glue layer comprises WCN, WN or a combination thereof.

10. A semiconductor device, comprising:
a substrate;
a gate electrode disposed over the substrate;
a gate dielectric layer disposed over the gate electrode;
a channel layer disposed over the gate dielectric layer;
a source electrode and a drain electrode disposed over the channel layer and beside the gate electrode, wherein each of the source electrode and the drain electrode comprises a glue layer and a metal pattern, and the glue layer is a tungsten-containing material,
wherein a thickness of the glue layer includes a variable thickness between the metal pattern and the gate dielectric layer, and the thickness of the glue layer is a minimum distance between an inner surface of the glue layer and an outer surface of the glue layer, and
wherein the glue layer between the metal pattern and the gate dielectric layer has a tapered thickness towards the channel layer.

11. The semiconductor device of claim 10, further comprising a dielectric layer aside the source electrode and the drain electrode, wherein the metal pattern is separated from both the channel layer and the dielectric layer.

12. The semiconductor device of claim 10, wherein the glue layer is further disposed between the channel layer and the metal pattern.

13. The semiconductor device of claim 10, wherein each of the source electrode and the drain electrode has an uneven bottom.

14. The semiconductor device of claim 10, wherein the channel layer comprises at least one element selected from the group consisting of In, Ga, Zn, W, Sn, Cd, Al and O.

15. A method of forming a semiconductor device, comprising:
providing a substrate;
forming a gate electrode over a substrate;
forming a gate dielectric layer over the gate electrode;
forming a channel layer over the gate dielectric layer; and
forming a source electrode and a drain electrode over the channel layer and beside the gate electrode,
wherein each of the source electrode and the drain electrode comprises a glue layer and a metal pattern,
wherein a thickness of the glue layer includes a variable thickness between the metal pattern and the gate dielectric layer, and the thickness of the glue layer is a minimum distance between an inner surface of the glue layer and an outer surface of the glue layer, and
wherein the glue layer between the metal pattern and the gate dielectric layer has a tapered thickness towards the channel layer.

16. The method of claim 15, wherein the glue layer comprises WCN, WN or a combination thereof.

17. The method of claim 15, wherein each of the source electrode and the drain electrode has an uneven bottom.

18. The method of claim 15, wherein precursors of forming the glue layer comprise a tungsten-containing precursor and a nitrogen-containing precursor.

19. The method of claim 18, wherein the tungsten-containing precursor comprises:
bis(tert-butylimino)bis(dimethylamino) tungsten(VI),
bis(iso-butylimino)bis(dimethylamino) tungsten(VI),
bis(neo-pentylimino)bis(dimethylamino) tungsten(VI),
bis(isopropylimino)bis(dimethylamino) tungsten(VI),
bis(cyclopentadienylimino)bis(dimethylamino) tungsten (VI), or
bis(methylcyclopentadienylimino)bis(dimethylamino) tungsten(VI).

20. The method of claim 18, wherein the nitrogen-containing precursor comprises $NH_3$ or $N_2$.

* * * * *